(12) United States Patent
Freimann et al.

(10) Patent No.: US 7,050,175 B1
(45) Date of Patent: May 23, 2006

(54) METHOD FOR CALIBRATING AN INTERFEROMETER APPARATUS, FOR QUALIFYING AN OPTICAL SURFACE, AND FOR MANUFACTURING A SUBSTRATE HAVING AN OPTICAL SURFACE

(75) Inventors: Rolf Freimann, Aalen (DE); Bernd Dörband, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 403 days.

(21) Appl. No.: 10/637,217

(22) Filed: Aug. 8, 2003

(51) Int. Cl.
*G01B 9/02* (2006.01)
(52) U.S. Cl. .................................. 356/512
(58) Field of Classification Search ............. 356/511, 356/512, 513, 514, 517
See application file for complete search history.

(56) References Cited

U.S. PATENT DOCUMENTS

| | | | |
|---|---|---|---|
| 4,340,306 A | 7/1982 | Balasubramanian |
| 4,732,483 A | 3/1988 | Biegen |
| 5,361,312 A | 11/1994 | Kuchel |
| 5,473,434 A | 12/1995 | de Groot |
| 5,488,477 A | 1/1996 | de Groot |
| 5,777,741 A | 7/1998 | Deck |
| 5,982,490 A | 11/1999 | Ichikawa |
| 2002/0063867 A1 | 5/2002 | Otto |
| 2002/0191193 A1 | 12/2002 | Smirnov et al. |

FOREIGN PATENT DOCUMENTS

JP 2001-255115 A 9/2001
WO WO03/002933 A1 1/2003

OTHER PUBLICATIONS

Al et al. "Measurement of the inhomeogeneity of a window," Optical Engineering 30:1399-1404 (1991).
Freimann et al. "Absolute measurement on non-comatic aspheric surface errors," Optics Communication 161:106-114 (1999).
Fritz "Absolute calibration of an optical flat," Optical Engineering 23:379-383 (1984).

(Continued)

*Primary Examiner*—Gregory J. Toatley, Jr.
*Assistant Examiner*—Michael A. Lyons
(74) *Attorney, Agent, or Firm*—Townsend and Townsend and Crew LLP (57) ABSTRACT

A method for qualifying and/or manufacturing an optical surface includes:
  arranging a first substrate having a first surface and a second surface opposite the first surface in a beam path of a first incident beam with the first surface facing towards the first incident beam, and taking an interferometric measurement of the second surface;
  arranging the first substrate in the beam path of the first incident beam with the second surface facing towards the first incident beam, and taking an interferometric measurement of the second surface;
  arranging a third surface of a second substrate in a beam path of a second incident beam, and taking an interferometric measurement of the third surface;
  arranging the third surface of the second substrate and the first substrate in the beam path of the second incident beam, and taking an interferometric measurement of the third surface.

38 Claims, 5 Drawing Sheets

OTHER PUBLICATIONS

Harihara "Interferometric testing of optical surfaces: absolute measure of flatness," Optical Engineering 36:2478-2481 (1997).

Ning et al. "Fringe beating effects induced by misalignment in a white-light interferometer," Measurement Science & Technology, 7:700-705 UK (1996).

Schwider et al. "Homogeneity testing by phase sampling interferometry," Applied Optics 24:3059-3061 (1985).

METHOD FOR CALIBRATING AN INTERFEROMETER APPARATUS, FOR QUALIFYING AN OPTICAL SURFACE, AND FOR MANUFACTURING A SUBSTRATE HAVING AN OPTICAL SURFACE

FIELD OF THE INVENTION

The present invention relates to the field of measuring and manufacturing optical surfaces. In particular the invention relates to a method for calibrating an interferometer apparatus for measuring an optical surface and/or a method for qualifying the optical surface by using the apparatus and/or a method for manufacturing an optical surface by using the interferometer apparatus.

BACKGROUND OF THE INVENTION

The substrate having the optical surface is, for example, an optical component such as an optical lens or an optical mirror used in optical systems, such as telescopes used in astronomy, or systems used for imaging structures of a mask ("reticle") onto a radiation sensitive substrate ("resist") in a lithographic method. The success of such an optical system is substantially determined by the precision with which the optical surface can be machined or manufactured to have a target shape. In such manufacture it is necessary to compare the shape of the machined optical surface with its target shape, and to determine differences between the machined and target surfaces. The optical surface is then further machined at those portions where differences between the machined and target surfaces exceed e.g. a predefined threshold.

Interferometric apparatuses are commonly used for high precision measurements of optical surfaces. Examples of such apparatus are disclosed in U.S. Pat. No. 4,732,483, U.S. Pat. No. 4,340,306, U.S. Pat. No. 5,473,434, U.S. Pat. No. 5,777,741, U.S. Pat. No. 5,488,477, which documents are incorporated herein by reference.

The conventional interferometer apparatus usually includes a reference surface which is illuminated with measuring light, and measuring light reflected back from the reference surface is imaged on a detector. Further, the optical surface to be measured is arranged in a same or separate beam of measuring light, and the optical surface is also imaged on the detector by using light reflected from the optical surface to be measured. The light reflected from the optical surface and the reference surface generate an interference pattern on the detector. By analyzing this pattern, shape differences between the reference surface and the optical surface to be measured can be determined in terms of wavelengths of the measuring light. Thus, the first approach to interferometrically measuring the optical surface allows the determination of the shape thereof only relative to the shape of the reference surface, the shape of which has to be determined by some independent procedure.

The deviation of an optical surface from its target surface is referred to as surface error in the following. The surface errors of an optical surface having a rotationally symmetric target surface may be separated in rotationally symmetric errors and rotationally asymmetric errors. The rotationally asymmetric errors of an optical surface may be absolutely measured according to a method disclosed in the article by R. Freimann et. al., "Absolute measurement of non-comatic aspheric surface errors", Optics Communications 161 (1996), pages 106 to 114, or as disclosed in US 2002/0063867A1. Here, the term "absolute measurement" means that the determined surface errors are absolute errors rather than relative errors depending on the shape of a reference surface. In this method optical path differences between the surface to be measured and the reference surface of the interferometer are separately measured for plural angular positions with respect to the optical axis of the surface to be measured. The plural measurements are averaged and represent the symmetric surface errors relative to the reference surface. Subtracting the averaged phase differences from the phase differences measured in one particular angular position will then result in a representation of the absolute asymmetric surface errors, however.

There are only few methods known for absolute measurement of rotationally symmetrical surface errors. One such method is illustrated in the article of P. Hariharan, Optical Engineering 36 (9), pages 2478 to 2481, September 1997, using an auxiliary mirror and at least two measuring positions involving high demands on mechanical precision of a measuring apparatus. A further method of such type is disclosed in the article of B. S. Fritz, "Absolute Calibration of an Optical Flat, Optical Engineering 23, page 379, 1984, involving three optical flats and two additional optical wedges of a big size and thermal and mechanical stability.

A method for the determination of the three-dimensional refractive index distribution of a GRIN-lens with plane surfaces is disclosed in US patent application US 2002/0191193 A1.

Further, it is an object of the present invention to provide an improved method for qualifying an optical surface. It is also an object of the present invention to provide an improved method of manufacturing an optical surface.

SUMMARY OF THE INVENTION

The forgoing objects are accomplished by providing a method for calibrating an interferometer apparatus for measuring an optical surface, wherein the method comprises four interferometric measurements of one and the other optical surface of a transparent substrate and of a mirror surface. An inventive method of qualifying an/or manufacture of an optical surface then involves interferometric measurement of the optical surface using the interferometer apparatus calibrated according to the above method. Further, the optical surface to be qualified or manufactured may be used in the method for calibrating the interferometric apparatus as one of the surfaces of the transparent substrate, or the mirror surface.

According to a preferred embodiment the four measurements include:
  measurement of a second surface of the transparent substrate by internally reflecting a measurement beam from the second surface through a first surface of the substrate;
  flipping the transparent substrate and measuring the second surface by externally reflecting the measuring beam from the second surface;
  measuring a mirror surface by reflecting the measuring beam therefrom wherein the transparent substrate is not placed in the measuring beam;
  measuring the mirror surface through the first and second surfaces of the transparent substrate arranged in the measuring beam.

Herein, all the above four measurements may be performed with respect to a reference surface of the interferometer.

If the transparent substrate has two substantially parallel surfaces the measurement of the second surface through the first surface thereof may be performed with respect to the reference surface of the interferometer or with respect to the first surface of the substrate.

The method of manufacturing the optical surface further includes machining of the optical surface after measuring the same, wherein the machining is performed in dependence of deviations of the measured optical surface from its target shape.

According to a preferred embodiment the method of manufacturing includes a final finishing of the machined optical surface.

The forgoing, and other features, and advantages of the invention will be more apparent from the following detailed description of preferred embodiments of the invention with reference to the accompanying drawings.

DETAILED DESCRIPTION

The embodiments of methods illustrated below involve interferometrically taking measurements of wavefronts generated by reflecting an incident beam provided by an interferometer apparatus from surfaces to be measured. Plural conventional interferometric methods may be used for taking such measurements. Examples of such interferometric methods are disclosed in e.g. U.S. Pat. No. 5,361,312, U.S. Pat. No. 5,982,490 and US 2002/0063867A1. The full disclosure of these patents and publications are incorporated herein by reference. An example of an interferometric method for measuring a first surface wherein a second surface parallel to the first surface is located in the beam path together with a reference surface is disclosed in U.S. Pat. No. 5,488,477 or Appendix A (a translation of WO 03/002933), wherein the full disclosure of these documents is incorporated herein by reference.

Figure 1A:
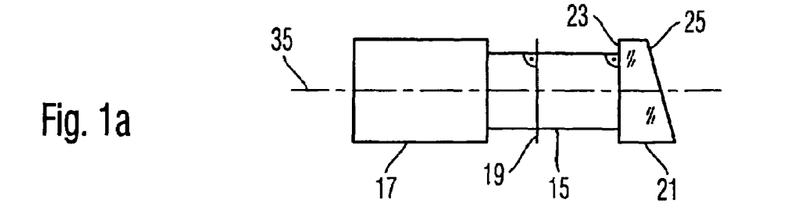
FIG. 1 illustrates a first embodiment of a method for calibrating an interferometer apparatus and for qualifying an optical surface.
Figure 1B:
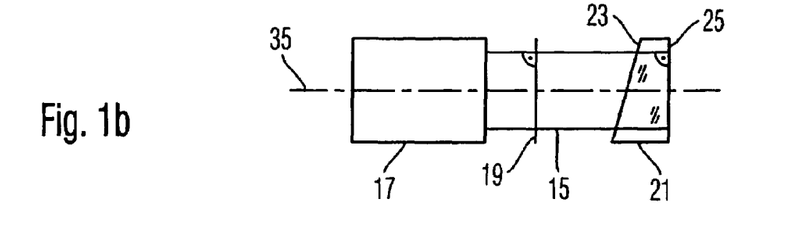
Figure 1C:
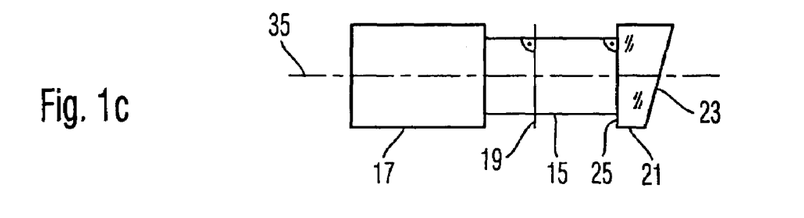
Figure 1D:
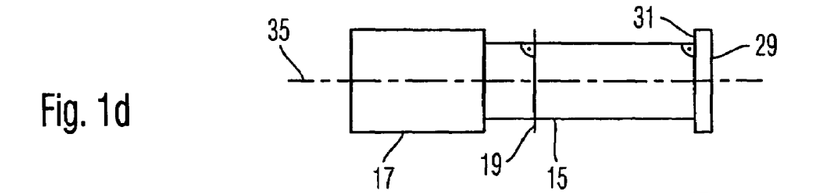
Figure 1E:
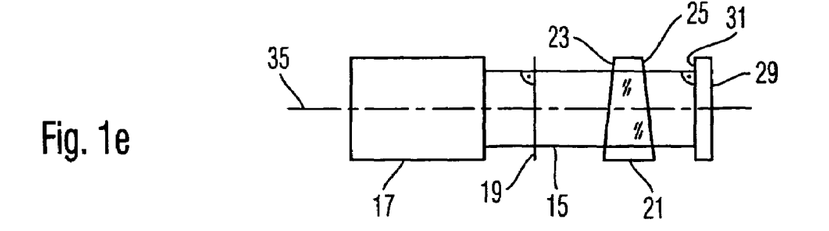
Figure 1F:
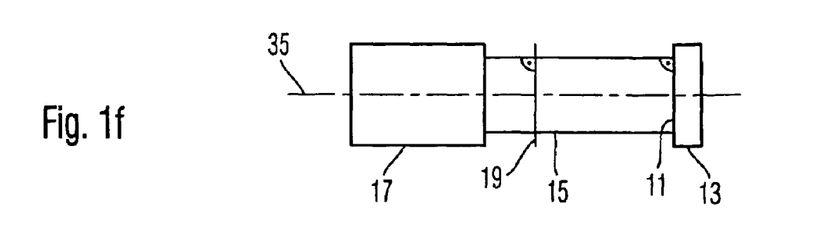

FIG. 1 illustrates a method of qualifying an optical surface 11 provided on a substrate 13 (FIG. 1f). The surface 11 may be, for example, a mirror surface or a transmissive surface when the substrate 13 is transparent. In the embodiment of FIG. 1 the surface 11 to be qualified is a substantially flat surface. One goal of the method is to determine deviations of surface 11 from a flat target shape.

In FIG. 1f there is shown a method step of interferometrically taking a measurement of optical surface 11 by using a parallel beam 15 of measuring light incident on surface 11 wherein the beam 15 is provided by an interferometer optics, which is schematically represented by box 17 in FIG. 1. The interferometer optics may be of any conventional type, and in particular of a type disclosed in U.S. Pat. No. 5,361,312, U.S. Pat. No. 5,982,490, US 2002/0063867A1, U.S. Pat. No. 5,488,477 or Appendix A (WO 03/002933).

In the beam path between interferometer optics 17 and optical surface 11 a reference surface 19 is provided, which is also a flat surface. Wavefronts of beam 15 reflected from the reference surface 19 interfere with wavefronts reflected from optical surface 11 on a light sensitive surface of a detector (not shown in FIG. 1) of the interferometer optics 17. An interference pattern generated by the detector will then be analyzed to produce a map representing an optical path difference between reference surface 19 and optical surface 11. Thus, optical surface 11 has been measured relative to the reference surface.

For determining deviations of optical surface 11 from its flat target surface a calibration of the interferometer 17 and its reference surface 19 is necessary. Such calibration is accomplished by performing the measuring steps illustrated in FIGS. 1a through 1e.

In a measuring step shown in FIG. 1a, a wedge shaped transparent substrate 21 having a first flat surface 23 and a second flat surface 25, is placed in the beam path of incident beam 15, such that the first surface 23 is facing towards the interferometer optics and reference surface 19, and further, such that measuring light beam 15 is substantially orthogonally incident on the first surface 23. A first interferometric measurement of first surface 23 is performed by allowing wave fronts reflected from first surface 23 and wave fronts reflected from reference surface 19 to interfere on the detector of interferometer optics 17. From the detected interference pattern a map $W_1$ is generated representing optical path differences between reference surface 19 and first surface 23. This map may be represented by $$W_1 = W_{int} + 2h_1 \quad (1)$$

wherein $W_{int}$ is a (yet unknown) map representing deviations of reference surface 19 from a perfectly flat surface and wherein $h_1$ represents deviations of first surface 23 from a perfectly flat surface. In this application the following convention with respect to signs of deviations is observed:

A deviation W of a wavefront is assigned a positive sign if the deviated wavefront advances the undeviated wavefront in the direction of travel. A deviation h of a surface is assigned a positive sign if it points outwardly away from the optical component on which it is provided.

In the step shown in FIG. 1b substrate 21 is oriented such that a wavefront reflected from second surface 25 is allowed to interfere with the wavefront reflected from reference surface 19. This means that, compared to FIG. 1a, wedge shaped substrate 21 is tilted such that first surface 23 does not contribute to the interference pattern generated on the detector of interferometer optics 17. From the detected interference pattern a map $W_1$ is generated representing path differences between reference surface 19 and second surface 25 wherein $W_2$ may be written as $$W_2 = W_{int} - 2(n-1)h_1 - 2n \cdot h_2 + i \quad (2)$$

wherein n is the average refractive index of the medium of substrate 21, $h_2$ is the deviation of second surface 25 from the perfectly flat surface, and i is the local deviation of the refractive index n of the medium of substrate 21.

In a step shown in FIG. 1c, and compared to FIG. 1b, substrate 21 is flipped or rotated about a horizontal axis by 180° such that wavefronts reflected back from the external surface of surface 25 are allowed to interfere with wavefronts reflected back from reference surface 19. From the detected interference pattern a map $W_3$ is determined which may be written in the form $$W_3 = W_{int} + 2h_2 \quad (3)$$

In a step shown in FIG. 1d substrate 21 is removed from the beam path of incident beam 15 and an auxiliary mirror 29 with its mirror surface 31 is arranged in the beam path of incident beam 15 such that wavefronts reflected from mirror surface 31 are allowed to interfere with wavefronts reflected from reference surface 19 on the detector of the interferometer optics 17. From the detected interference pattern a map $W_4$ representing path differences between reference surface 19 and mirror surface 31 is generated. Map $W_4$ may be written as $$W_4 = W_{int} + 2h_m \quad (4)$$

wherein $h_m$ represents deviations of mirror surface 31 from the perfectly flat shape.

In a step shown in FIG. 1e mirror 29 is in the same position as shown in FIG. 1d. However, substrate 21 is arranged in the beam path between reference surface 19 and mirror surface 31, such that the first surface 23 of substrate 21 faces towards the interferometer optics 17 and reference surface 19. Further, compared to FIGS. 1a and 1b, the wedge shaped substrate 21 is tilted such that none of the first surface 23 and second surface 25 of the substrate 21 substantially contributes to an interference pattern generated by wavefronts reflected back from reference surface 19 and mirror surface 31. The measuring beam 15 passes through substrate 21 which effects the transmitted beam due to deviations from its prescribed properties, such as surface shape and homogeneity of the refractive index of its medium. From the detected interference pattern a map $W_5$ representing path differences between reference surface 19 and mirror surface 31 is generated. Map $W_5$ may be written as $$W_5 = W_{int} + 2h_m - 2(n-1)h_1 - 2(n-1)h_2 + i \quad (5)$$

By performing the steps shown in FIGS. 1a through 1e, the interferometer 17 with its reference surface 19, the first surface 23 and the second surface 25 of substrate 21 and the local deviations of the refractive index of the substrate 21 are completely calibrated and may be determined from the equations below. At first, a difference $W_D$ between maps $W_5$ and $W_4$ may be rewritten as $$W_D = W_5 - W_4 = -2(n-1)h_1 - 2(n-1)h_2 + i \quad (6)$$

From formulas 1 through 6 above the deviations $h_1$ of first surface 23 of substrate 21 from the perfectly flat surface may be written as $h_1$ $$h_1 = \tfrac{1}{4}(2W_1 - W_2 - W_3 + W_D) \quad (7)$$

Similarly, the deviations of second surface 25 of substrate 21 from the perfectly flat surface may be written as $$h_2 = \tfrac{1}{4}(-W_2 + W_3 + W_D) \quad (8)$$

Further, the deviations of the refractive index of substrate 21 may be written as i $$i = (n-1)(W_1 - W_2) + n\, W_D \quad (9)$$

Finally the interferometer error or deviations of the shape of wavefronts generated by the interferometer 17 and reference surface 19 deviating from plane wavefronts may be represented as $W_{int}$ $$W_{int} = \tfrac{1}{2}(W_2 + W_3 - W_D) \quad (10)$$

In the step shown in FIG. 1f wavefronts reflected back from reference surface 19 are allowed to interfere with wavefronts reflective from optical surface 11 to be qualified and manufactured, and a map $W_6$ generated from an interference pattern detected in this step may be written as $W_6$ $$W_6 = W_{int} + 2h_o \quad (11)$$

wherein $h_o$ represents deviations of optical surface 11 from its perfectly flat shape. Thus, it is possible to qualify optical surface 11 in absolute terms with respect to a perfectly flat surface rather than merely determining optical surface 11 relative to reference surface 19 to be calibrated independently.

Equation (11) may be rewritten as $$h_0 = \tfrac{1}{2}(W_6 - W_{int}) \quad (12)$$

which represents a map of deviations of optical surface 11 from its perfectly flat shape, wherein $W_{int}$ is determined according to equation (11).

Having qualified optical surface 11 it is then possible to identify those regions on surface 11 where deviations from the flat shape exceed a certain threshold. A machining step is then performed to reduce these deviations. The machining may comprise polishing or ion beam etching and other methods.

Thereafter, the measurement according to FIG. 1f is repeated to determine a new map $h_o$ of deviations of surface 11 from its flat target surface. If these deviations still exceed the predetermined threshold a further machining step is performed. Otherwise, a finishing step is performed on the optical surface 11. The finishing may include a final polishing of the surface or depositing a reflection coating or an anti-reflection coating. A reflection coating may include, for example, a plurality of material layer pairs, for example 40 pairs of alternating molybdenum and silicon layers or other conventional layers.

Thicknesses of these latter layers may be about 5 nm and will be adapted to a wavelength to be reflected from the optical surface, such that a reflection coefficient is substantially high. Finally, the reflection coating may be covered by a cap layer for passivating the reflection coating. The cap layer may include a layer formed by depositing ruthenium, for example.

An anti-reflection coating which is intended to reduce reflections of radiation of an interface of an optical element, such as a lens element, may include magnesium fluoride or lanthanum oxide or other conventional materials. The above mentioned threshold value will differ from the application of the optical surface in the optical system for which it is designed. For example, if the optical surface is a lens surface in an objective for imaging a reticle structure onto a resist with radiation of a wave length ###=193 nm, such threshold value may be in a region of about 2 nm to 10 nm, and if the optical surface will be used as a mirror surface in an imaging objective using EUV (extreme ultraviolet) radiation with a wave length of ###=13.5 nm, the threshold value will be in a region of about 0.1 nm to 1.0 nm.

From the above it appears that for determining the deviations $h_o$ of optical surface 11 it is not necessary to perform the step of FIG. 1a since the map $W_1$ determined therein (see equation (1)) does not enter into equation (12).

Figure 2:
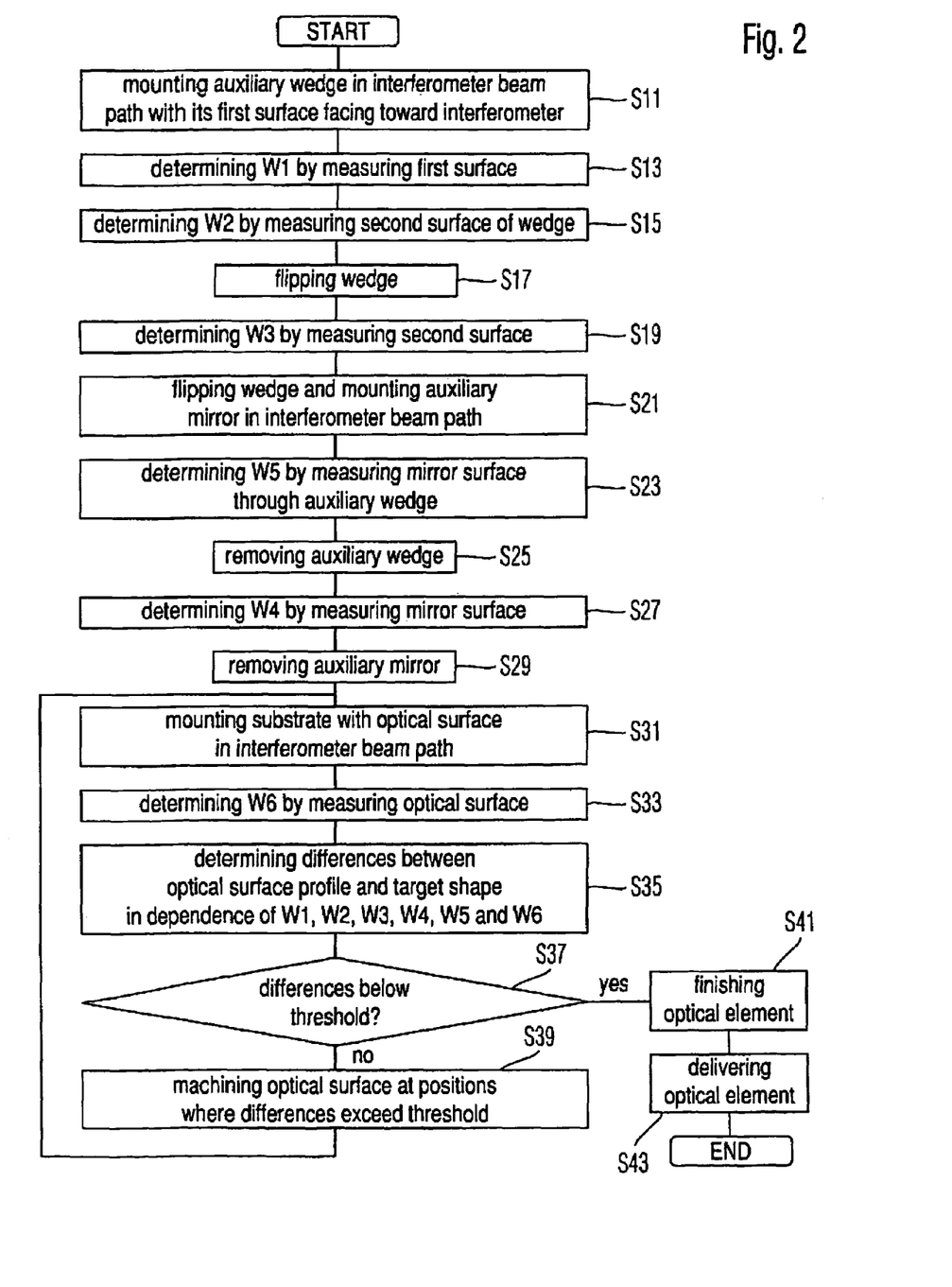
FIG. 2 is a flow chart of a method of manufacture for the optical surface qualified by the method illustrated in FIG. 1.

The method of manufacturing optical surface 11 is summarized with reference to FIG. 2:

After providing the interferometer optics 17 with its reference surface 19 the auxiliary wedge shaped substrate 21 is arranged in the interferometer beam path in a step S11 as shown in FIG. 1a. Thereafter, the first surface 23 of substrate 21 is measured, and map $W_1$ according to equation (1) is calculated in a step S13. Thereafter, in a step S15, the wedge 21 is rearranged for measuring its second surface 25 and determining map $W_2$.

Wedge 21 is flipped or reversed in step S17 such that its second surface 25 faces the interferometer, and map $W_3$ is determined in S19. Thereafter, in a step S21, wedge 21 is flipped back to its orientation in step S11, but tilted such that none of its first or second surfaces contributes to an interference pattern generated by reflecting the interferometer beam back from the auxiliary mirror 29. Mirror surface 31 is measured in step S23 and map $W_5$ is generated.

In a step S25 wedge 21 is removed, and the mirror surface is measured for determining map $W_4$ in step S27. Thereafter, in step S29 the auxiliary mirror is removed and the optical surface 11 to be qualified and manufactured is mounted in the beam path in a step S31. Optical surface 11 is measured in a step S33 in which map $W_6$ is determined. In a following step S35 differences $h_o$ between optical surface 11 and its target surface, i.e. the flat surface, are determined from maps $W_2$, $W_3$, $W_4$, $W_5$ and $W_6$ in step S35.

In a decision step S37 it is determined whether the differences determined in step S35 are below a pre-determined threshold. If not, the optical surface 11 is machined in a step S39 to reduce these differences, and the method is continued with step S31, i.e. mounting the optical surface in the interferometer beam path again. If the differences are below the threshold the optical element 13, including its optical surface 11, undergo a finishing procedure in a step S41 and the optical element is delivered in a step S43.

It is to be noted that it is not necessary that the above-mentioned threshold is a constant threshold over the whole area of the optical surface. It is possible that the threshold is dependent on e.g. a distance from a center of the surface or some other parameter.

Further, all measurements illustrated above with reference to FIG. 1 may be repeated with arranging the measured surfaces 23, 25, 31 and 11 under plural different angular positions with respect to an optical axis 35 of the interferometer 17.

Further, the steps shown in FIGS. 1a through 1f may be performed in any order as already indicated in FIG. 2 where the determination of map $W_5$ is performed before determination of map $W_4$. However, in particular steps according to FIGS. 1b and 1e may be performed in any order. Further, for merely determining $h_o$ it is not necessary to perform step S13 according to FIG. 1a for determining map $W_1$.

In the method illustrated above with reference to FIG. 1, substrate 21 is arranged in the step illustrated in FIG. 1e in the same orientation as in the step illustrated in FIG. 1b, i.e. in both steps the first surface 23 of substrate 21 faces towards reference surface 19. However, it is also possible to perform the step corresponding to FIG. 1e such that substrate 21 has an orientation as shown in FIG. 1c, i.e. first surface 23 of substrate 21 faces away from reference surface 19.

In the above manufacturing method illustrated with reference to FIGS. 1 and 2, the optical surface to be manufactured is different from the surfaces 23 and 25 of substrate 21 and mirror surface 31 of mirror 29. It is, however, possible that surface 23 of substrate 21 is to be machined to be a flat surface. Then $h_1$ determined according to equation (7) may be compared to a threshold for determining regions of surface 23 which need further machining. Similarly, deviations of surface 25 from its flat target surface may be determined according to equation (8) and machining of surface 25 may be performed accordingly.

Further, a map $h_M$ for mirror surface 31 may be determined according to $$h_M = \tfrac{1}{4}(2W_4 - W_2 - W_3 - + W_D), \tag{13}$$

and machining of mirror surface 31 may be performed after a comparison of $h_M$ with a threshold, for manufacturing a flat mirror.

In the following further embodiments of the invention will be illustrated with reference to FIGS. 3 to 5. Herein, the same reference numerals are assigned to components which correspond to components illustrated in the previous embodiment with reference to FIGS. 1 and 2. However, an additional letter is assigned to the reference numerals for distinguishing purposes.

FIG. 3 illustrates a method for qualifying a spherical optical surface 11a of a mirror 13a. This qualification is performed in a step illustrated in FIG. 3f which is similar to the step illustrated in FIG. 1f. Again an interferometer optics 17a is used to provide a parallel beam 15a of measuring light which passes a reference surface 19a for reflecting back wavefronts to the interferometer. However, a lens 39 is provided in beam 15a to transform the parallel beam 15a into a convergent beam 16 which passes through a cross-over region 18 on an optical axis 35a of the interferometer optics 17a. After passing the cross-over region the incident beam of measuring light forms a diverging beam 20 which is incident on optical mirror surface 11a which is rotationally symmetrically arranged with respect to the optical axis 35a.

In this arrangement wave fronts of divergent beam 20 reflected back from the optical surface 11a are allowed to interfere with wave fronts reflected back from reference surface 19a on a detector of the interferometer optics 17a. From a detected interference pattern a map $h_o$ representing relative optical path differences between mirror surface 11a and reference surface 19a may be derived, wherein map $h_o$ may be represented according to equation (12) above. From equation (12) it is apparent that the measurement shown in FIG. 3f is only a relative measurement of optical mirror surface 11a. For an absolute determination of surface errors of spherical surface 11a the interferometer 17a, including reference surface 19a, have to be calibrated by performing the method illustrated in FIGS. 3a through 3e.

Figure 4:
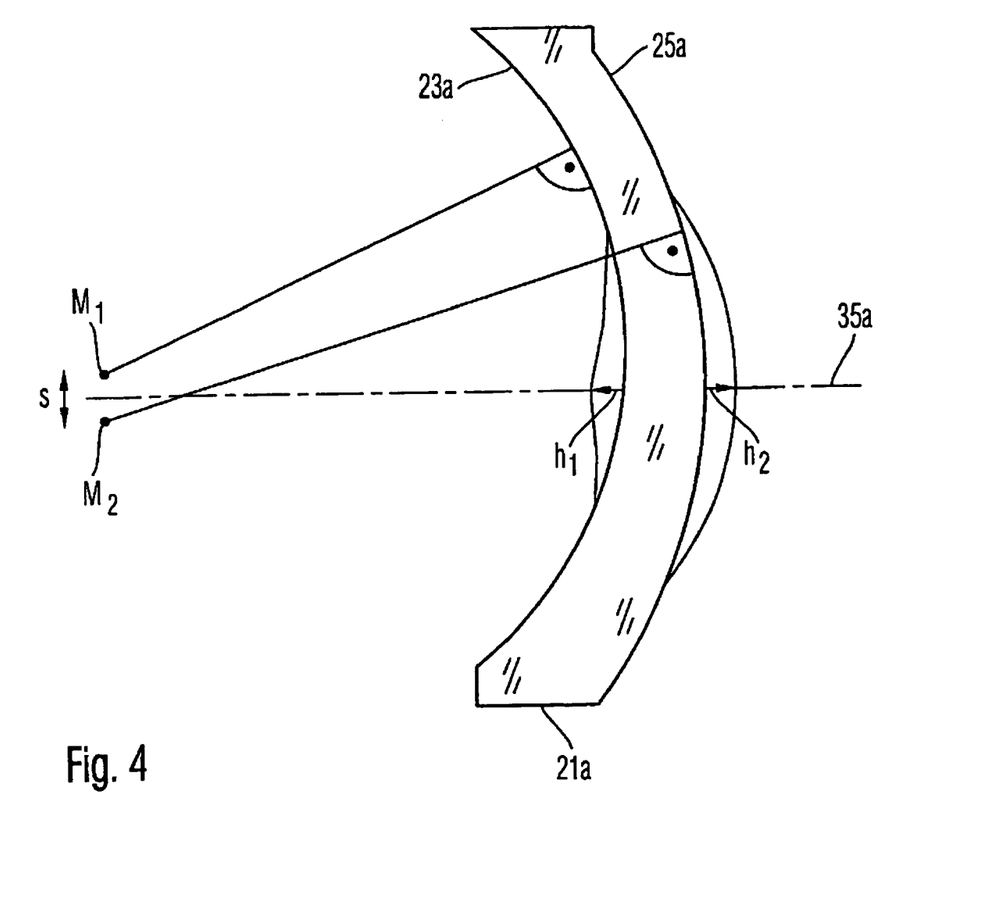
FIG. 4 shows a cross-section through a transparent substrate used in the method according to FIG. 3.

The method uses an auxiliary wedge shaped meniscus lens 21a illustrated in FIG. 4. Meniscus lens 21a has a concave spherical first surface 23a having a center of curvature $M_1$, and a convex spherical second surface 25a having a center of curvature $M_2$. The centers of curvature $M_1$ and $M_2$ are displaced transversely to optical axis 35a with respect to each other by an amount s, such that lens 21a is wedge shaped in that sense that its width in an upper portion in FIG. 4 is larger than a corresponding width in its lower portion. Such wedge shape has a function similar to that of the auxiliary substrate in the method according to FIG. 1, which is to avoid interference of wave fronts reflected back from first surface 23a with wave fronts reflected back from surface 25a.

In FIG. 4 the perfect spherical shape of first and second surfaces 23a and 25a is drawn with a thick line. The deviation from the perfect spherical shapes on both the first and second surfaces is shown with a thin line. Further, deviations from the spherical shape of the first and second surfaces are indicated as arrow $h_1$ and $h_2$. From the direction of arrows $h_1$ and $h_2$ the sign convention used in this application is apparent. Surface deviations have a positive sign if they are oriented away from the substrate on which the respective surface is provided.

Figure 3A:
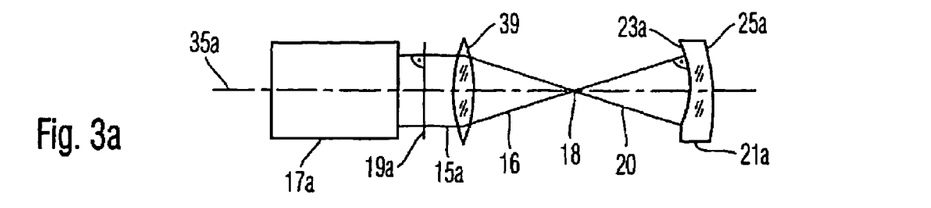
FIG. 3 illustrates a second embodiment of a method for calibrating an interferometer apparatus and for qualifying an optical surface.

In a method step illustrated in FIG. 3a meniscus lens 21a is arranged in divergent incident beam 20 such that wave fronts reflected back from its first surface 23a are allowed to interfere with wave fronts reflected back from reference surface 19a. From the resulting interference pattern a map $W_1$ is generated which conforms to equation (1) above.

Figure 3B:
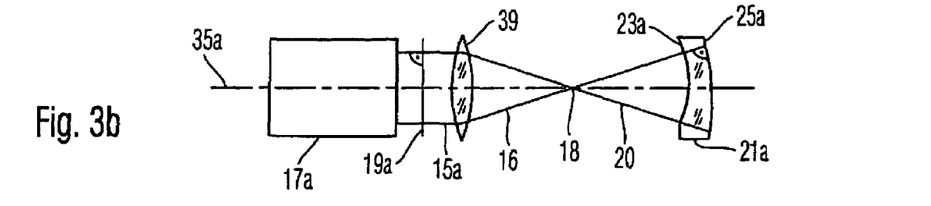

In a step shown in FIG. 3b the meniscus lens 21a is arranged such that wave fronts of divergent beam 20 incident on second surface 25a through first surface 23a and reflected back from second surface 25a through first surface 23a are allowed to interfere with wave fronts reflected back from reference surface 19a on the detector of interferometer optics 17a. From the detected interference pattern a map $W_2$ is generated which may be written in accordance with equation (2) above.

Figure 3C:
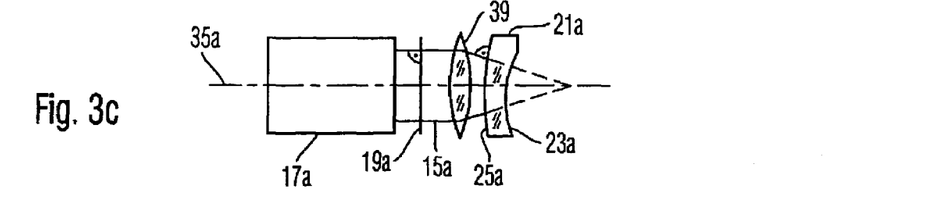

Compared to FIG. 3b the meniscus lens 23a is rotated about a horizontal axis by 180 degrees in FIG. 3c such that the second surface 25a faces towards lens 39 and such that second surface 25a is arranged such that convergent beam 16 is incident from the exterior or on faces towards reference surface 19a, and second surface 25a. Wave fronts reflected back from second surface 25a are allowed to interfere with wave fronts reflected back from reference surface 19a on the detector of the interferometer optics. From the detected interference pattern a map $W_3$ representing optical path differences between second surface 25a and reference surface 19a is derived. Map $W_3$ may be written according to equation (3) above.

Figure 3D:
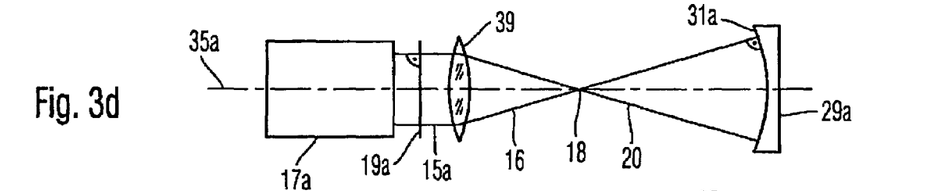

In a step illustrated in FIG. 3d wedge shaped lens 21a is removed from the interferometer beam path, and an auxiliary mirror 29a having a concave spherical mirror surface 31a is arranged in the divergent beam 20a such that wave fronts reflected back from mirror surface 31a are allowed to interfere with wave fronts reflected back from reference surface 19a. From a detected interference pattern a map $W_4$ representing optical path differences between mirror surface 31a and reference surface 19a is generated. This map $W_4$ may be rewritten according to equation (4) above.

Figure 3E:
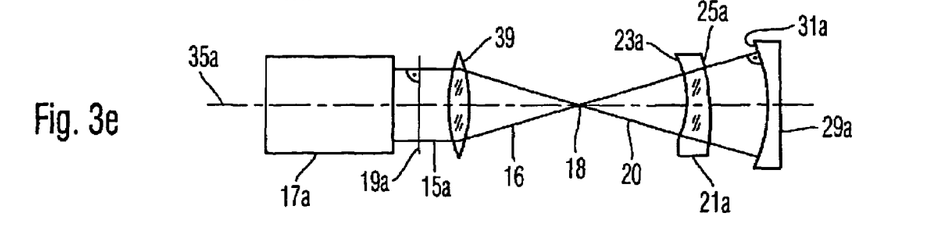
Figure 3F:
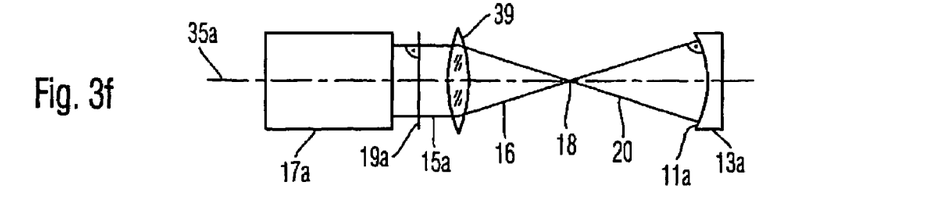

In a step shown in FIG. 3e the auxiliary mirror 29a is in the same position as in step shown in FIG. 3d. However, the meniscus lens is arranged in the divergent beam 20 such that its concave first surface 23a faces towards cross-over region 18. Further, wedge shaped lens 21a is oriented such that wave fronts of divergent beam 20a reflected back from its first or second surfaces 23a, 25a are not allowed to interfere with wave fronts reflected back from reference surface 19a. Wave fronts reflected back from reference surface 19a are allowed, however, to interfere with wave fronts reflected back from auxiliary mirror surface 31a. From a resulting interference pattern a map $W_5$ is generated which may be written according to equation (5) above.

Using formulas 6 to 12 above deviations of optical surface 11a of mirror 13a to be qualified or manufactured may be determined. Further, deviations $h_1$ and $h_2$ (see equations (7) and (8) above) of the first and second surfaces 23a and 25a of meniscus lens 21a may be calculated. Further, deviations i of the index of refraction of the medium of meniscus lens 21a from its average value n may be determined by using equation (9) above. Further, the interferometer errors including deviations of reference surface 19a from its target shape may be represented by using equation (10) above.

Since $h_1$ and $h_2$ may be determined it is also possible to manufacture meniscus lens 21a to a high precision using the qualifying method illustrated above. Further, using formula (13) above it is possible to qualify surface 31a of auxiliary mirror 29a such that this surface may also be machined to a high precision.

Figure 5A:
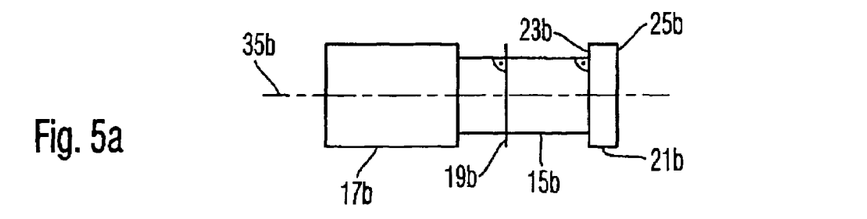
FIG. 5 illustrates a third embodiment of a method for calibrating an interferometer apparatus and for qualifying an optical surface.
Figure 5B:
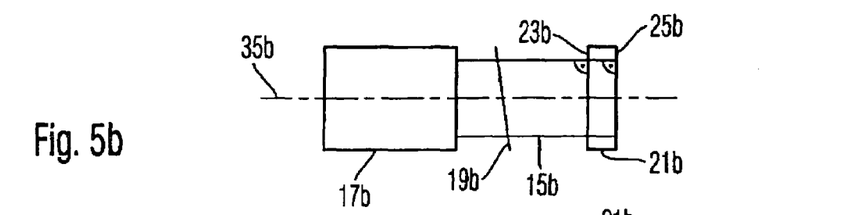

In FIG. 5 a further method for qualifying flat surfaces is illustrated. Different from the method illustrated in FIG. 1, an auxiliary transparent substrate 21b used in the method illustrated in FIG. 5 has first and second surfaces 23b and 25b which are parallel to each other. By using the equations developed above it is possible to use the method illustrated in FIG. 5 as a method of qualifying substrates having two parallel surfaces. However, a substrate having two parallel surfaces 23b and 25b arranged in a beam 15b of measuring light provided by an interferometer 17 will exhibit the following peculiarity:

Referring to FIG. 5b where substrate 21b is arranged in incident beam 15b such that its second surface 25b faces away from the interferometer 17b and such that the second surface 25b is imaged on the detector of the interferometer. In such a situation wavefronts reflected back from second surface 25b will interfere with wavefronts reflected back from first surface 23b of substrate 21b. To avoid further interference of wavefronts reflected from reference surface 19b with wavefronts reflected from first and second surfaces 23b and 25b, reference surface 19b is slightly tilted away from its orthogonal orientation with respect to optical axis 35b. A map $W_{fr}$ generated from an interference pattern obtained by wavefronts reflected back from a first (front) surface 23b interfering with wavefronts reflected back from second (rear) surface 25b may be written as $$W_{fr} = -2nh_1 - 2n \cdot h_2 + i \tag{14}$$

All other steps shown in FIGS. 5a, 5c, 5d, 5e and 5f correspond to steps shown in FIGS. 1a, 1c, 1d, 1e and 1f, respectively.

In a step shown in FIG. 5a wavefronts reflected back from first surface 23b of substrate 21b interfere with wavefronts reflected back from reference surface 19b, and a map $W_1$ which may be represented according to equation (1) is generated.

Figure 5C:
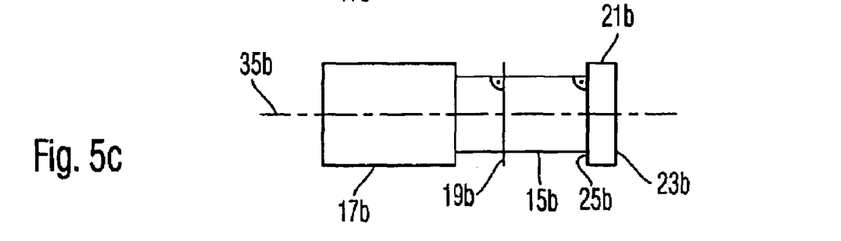

In a step shown in FIG. 5c wavefronts reflected back from second surface 25b of reverted substrate 21b are allowed to interfere with wavefronts reflected back from reference surface 19b. A map $W_3$ is generated from the resulting interference pattern where in map $W_3$ may be represented according to equation (3) above.

Figure 5D:
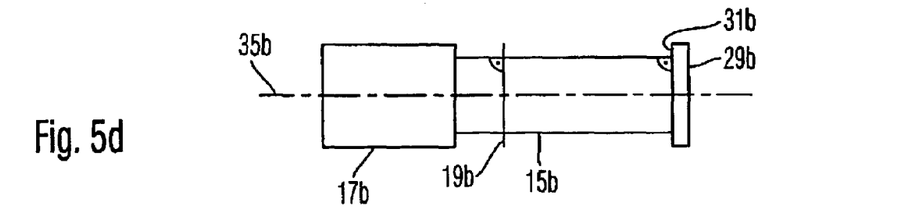

In a step shown in FIG. 5d wavefronts reflected back from a mirror surface 31b of an auxiliary mirror 29b are allowed to interfere with wavefronts reflected back from reference surface 19b, and a map $W_4$ is generated which obeys equation (4) above.

Figure 5E:
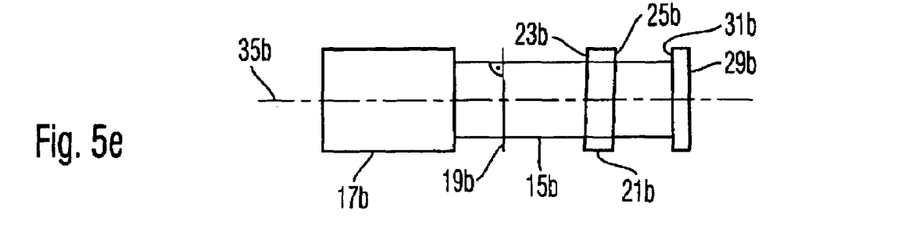

In a step shown in FIG. 5e the substrate 21b is placed in the beam path between reference surface 19b and auxiliary mirror surface 31b such that surfaces 23b and 25b thereof do not contribute to the resulting interference pattern. A map $W_5$ is generated which may be represented according to equation (5) above.

Figure 5F:
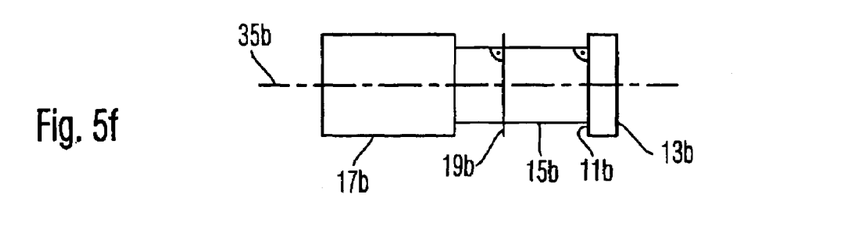

If a substrate 13b which is different from substrate 21b or mirror 29b has a flat surface 11b which has to be qualified using the interometer optics 17b it is then possible to perform a step shown in FIG. 5f where a map $W_6$ representing optical path differences between reference surface 19b and flat optical surface 11b is generated. This map $W_6$ may be written according to equation (11) above. Deviations $h_0$ of measured optical surface 11b from its flat target shape may be represented according to equation (12) above wherein $W_{int}$ of this equation is calculated using $W_{fr}$ determined in the step according to FIG. 5 according to $$W_{int}=\tfrac{1}{2}(W_1+W_{fr}+W_3-W_D) \qquad (15)$$

The deviations $h_1$ of the first surface 23b of substrate 21b and the deviations $h_2$ of second surface 25b of substrate 21b may be calculated according to:

$$h_1=\tfrac{1}{4}(W_1-W_{fr}-W_3+W_D) \qquad (16)$$

$$h_2=\tfrac{1}{4}(-W_1-W_{fr}+W_3+W_D) \qquad (17)$$

Further, the linear components of the local deviation i of the refractive index can be obtained from steps illustrated in FIGS. 5b, 5d and 5e, because the unknown tilt of substrate 21b does not enter the measured wavefronts. These linear components of i are contained in e.g. (9) and can be extracted via Zernike-Fit of linear terms. In addition a residual mechanical wedge of substrate 21b can be obtained from these three steps and from $$h_1+h_2=\frac{W_D-W_{fr}}{2}=\frac{1}{2}(W_5-W_4-W_{fr}). \qquad (18)$$

This method of determining a mechanical wedge is unique in the sense that it is an optical method and that it measures the wedge across the whole substrate and not locally.

The disadvantage of complicated interference fringes generated by three interfering wavefronts reflected back from the first and second surfaces 23b and 25b of substrate 21b and from reference surface 19b may be avoided by using an interometer system and method as disclosed in U.S. Pat. No. 5,488,477 or Appendix A (WO 03/002933) in which an external cavity diode laser (ECDL) is used for generating the measuring beam of the interferometer. By generating measuring light of different frequencies and averaging the resulting interference pattern it is possible to suppress an undesirable influence of a reflection from a particular surface in the interference pattern.

Further, an interfometer system and method may be employed using light having a coherence length shorter than a distance between adjacent parallel surfaces to suppress the above mentioned problems of having three parallel reflecting surfaces in a beam path of an interferometer. Interferometer systems and methods employing light of such short coherence length are also referred to as white light interferometer systems and method, or OCT (optical coherence tomography) interferometer systems and methods. Examples of such type of interferometer systems are disclosed in JP 2001 255 115 A or in the article of Y. N. Ning et al., "Fringe beating effects induced by misalignment in a white-light interferometer Measurement", Science and Technology, Vol. 7, pages 700 to 705, 1996.

The method illustrated above with reference to FIG. 5 may be applied to meniscus lenses having two surfaces having a common center of curvature. This will result in interference patterns generated by interfering wavefronts reflected back from the first and second surfaces of such a meniscus lens. It is then possible to slightly tilt a reference surface of the interferometer such that wavefronts reflected back therefrom do not contribute to the interference (see FIG. 5b). It is also possible to use an interferometer and method as disclosed in U.S. Pat. No. 5,488,477 or Appendix A (WO 03/002933) or a white light interferometer and method.

It is to be noted that all of the method steps illustrated in the FIGS. 1, 3 and 5 may be performed in an arbitrary sequence.

Further, if the surface to be qualified is different from the surfaces of the auxiliary substrate and the auxiliary mirror (see FIGS. 1f, 3f and 5f) it will not be necessary to perform the steps shown in FIGS. 1a, 3a and 5a. These steps will have to be performed if the surfaces errors of one of the surfaces of the auxiliary substrate or the auxiliary mirror are to be determined.

In the above, where maps of surface errors are determined by an interferometric measurement any method for interferogram evaluation may be used. Possible applicable methods are disclosed in the book edited by Daniel Malacara, Optical Shop Testing, 2nd edition, Wiley interscience Publication (1992). Further, methods of phase shifting interferometry (PSI) may be applied, wherein a plurality of interferograms are analyzed for producing a surface map. Examples of phase shifting interferometry are also presented in the book mentioned above by Malacara. The phase shift is advantageously generated by varying the wavelength of the light providing the interferometric measuring beam using a wavelength tunable light source.

It is to be noted that among the determined surface errors mentioned above, those components of the surface errors are absolutely determined which have an even symmetry with respect to the axis around which substrate 21 is flipped between steps a and c in FIGS. 1, 3 and 5. The rotationally symmetric components of the errors may be obtained by an analysis involving e.g. Zernike polynomials.

Further, steps 1d and 1e as well as 5d and 5e or 3d and 3e may be performed simultaneously by choosing the diameter of mirror surface 31 or 31a or 31b respectively larger than the diameter of substrate 21, 21a, 21b respectively. This procedure eliminates drifts of the interferometer which otherwise could occur between steps d and e.

In the above illustrated embodiments the surface to be manufactured is a perfectly flat surface or a perfectly spherical surface, respectively. It is to be noted however, that the surfaces to be manufactured may be different from such shapes. This may involve using target shapes which are different from the perfectly flat or spherical shape for manufacturing surfaces with a shape corresponding to that of the target shape. For instance, the target surface shape of the optical surface to be manufactured may differ from a surface corresponding to the perfectly flat or spherical surface by a position dependent amount $h_i^*$ representing a predetermined input offset. In such instance equations (7), (8), (12) and (13) may be rewritten as:

$$h_1=\tfrac{1}{4}(2W_1-W_2-W_3+W_D)-h_{i1}, \qquad (7')$$

$$h_2=\tfrac{1}{4}(-W_2+W_3+W_D)-h_{i2}, \qquad (8')$$

$$h_0=\tfrac{1}{2}(W_6-W_{int})-h_{i0}, \qquad (12')$$

$$h_M=\tfrac{1}{4}(2W_4-W_2-W_3+W_D)-h_{iM}. \qquad (13')$$

$h_i^*$ may represent offsets such as a defocus, i.e. a paraboloidal deviation, an aspherical surface shape, or others. Thus, it is possible to manufacture e.g. a high precision ashperical surface which is close to a flat surface or a spherical surface, respectively. If the surface to be manufactured is a simple surface having a shape close to the perfectly flat or spherical shape, the input offset will be set to zero as previously described with respect to equations (7), (8), (12) and (13) and with reference to FIG. 2. However, the case of one or more offsets being different from zero are an integral part of the preferred embodiments of the invention.

It is further to be noted that the optical components involved in the above interferometric methods are subject to gravity during measurement. This may result in deformations of the surfaces of those components which are fixed in suitable mounts for arranging the components within the beam path of the interferometer. Even though the optical axis 35 is oriented horizontally in FIGS. 1, 3 and 5, it is also possible to perform the same measurements with an optical axis oriented vertically in the gravitational field. In any event, it is possible to use mathematical methods to simulate deformations of the optical components in the gravitational field. One such method is known as FEM ("finite element method"). All determinations of optical properties and deviations illustrated above may involve taking into account results of such mathematical methods for correcting and/or improving the determined results.

Therefore, while the present invention has been shown and described herein in what is believed to be the most practical and preferred embodiments, it is recognized that departures can be made therefrom within the scope of the invention, which is therefore not be limited to the details disclosed herein but is to be accorded the full scope of the claims so as to embrace any and all equivalent methods and apparatus.

The invention claimed is:

1. A method for calibrating an interferometer optics for measuring optical surfaces, said method comprising:
    arranging a first substrate having a first surface and a second surface opposite said first surface in a beam path of a first incident beam provided by said interferometer optics with said first surface facing towards said first incident beam, and interferometrically taking a first measurement of first wave fronts generated by reflecting said first incident beam from said second surface of said first substrate;
    arranging said first substrate in said beam path of said first incident beam with said second surface facing towards said first incident beam, and interferometrically taking a second measurement of second wave fronts generated by reflecting said first incident beam from said second surface of said first substrate;
    arranging a third surface of a second substrate in a beam path of a second incident beam, and interferometrically taking a third measurement of third wave fronts generated by reflecting said second incident beam from said third surface of said second substrate, while said first substrate is not arranged in said beam path of said second incident beam;
    arranging said third surface of said second substrate and said first substrate in said beam path of said second incident beam, and interferometrically taking a fourth measurement of fourth wave fronts generated by reflecting said second incident beam from said third surface and through said first substrate; and
    determining optical properties of said interferometer optics in dependence of said first, second, third and fourth measurements.

2. The method according to claim 1, wherein said second incident beam is provided by said interferometer optics.

3. The method according to claim 1, wherein said first and second surfaces of said first substrate and said third surface of said second substrate are substantially flat surfaces and wherein light of said first and second incident beams has substantially flat wave fronts.

4. The method according to claim 1, wherein said first and second surfaces of said first substrate and said third surface of said second substrate are substantially spherical surfaces and wherein light of said first and second incident beams has substantially spherical wave fronts.

5. The method according to claim 1, wherein said first substrate is of a wedge shape.

6. The method according to claim 1, wherein said interferometer has an optical axis and wherein said optical properties are rotationally symmetric properties with respect to said optical axis.

7. The method according to claim 1, wherein said second measurement is taken by superimposing said second wave fronts with first reference wave fronts generated by reflecting said first incident beam from a reference surface of said interferometer optics.

8. The method according to claim 1, wherein said third measurement is taken by superimposing said third wave fronts with second reference wave fronts generated by reflecting said second incident beam from a reference surface.

9. The method according to claim 1, wherein said fourth measurement is taken by superimposing said fourth wave fronts with second reference wave fronts generated by reflecting said second incident beam from a reference surface.

10. The method according to claim 1, wherein said first measurement is taken by superimposing said first wave fronts with first reference wave fronts generated by reflecting said first incident beam from a reference surface of said interferometer optics.

11. The method according to claim 10, wherein said optical properties of said interferometer optics substantially correspond to phase differences determined by a formula $$Wint=\tfrac{1}{2}(W2+W3+W4-W5),$$

wherein:
    Wint represents said phase differences of said interferometer optics,
    W2 represents phase differences determined from said first measurement,
    W3 represents phase differences determined from said second measurement,
    W4 represents phase differences determined from said third measurement, and
    W5 represents phase differences determined from said fourth measurement.

12. The method according to claim 1, wherein said first measurement is taken by superimposing said first wave fronts with fifth wave fronts generated by reflecting said first incident beam from said first surface of said first substrate.

13. The method according to claim 12, further comprising:
    arranging said first substrate in said beam path of said first incident beam with said first surface facing towards said first incident beam, and interferometrically taking a fifth measurement of sixth wave fronts generated by reflecting said first incident beam from said first surface; and
wherein said optical properties of said interferometer optics substantially correspond to phase differences determined by a formula $$Wint=\tfrac{1}{2}(W1+Wfr+W3+W4-W5),$$

wherein:
    Wint represents said phase differences of said interferometer optics, W1 represents phase differences determined from said fifth measurement,
Wfr represents phase differences determined from said first measurement,
W3 represents phase differences determined from said second measurement,
W4 represents phase differences determined from said third measurement, and
W5 represents phase differences determined from said fourth measurement.

14. A method for processing a substrate having an optical surface, said method comprising:
arranging a first substrate having a first surface and a second surface opposite said first surface in a beam path of a first incident beam with said first surface facing towards said first incident beam, and interferometrically taking a first measurement of first wave fronts generated by reflecting said first incident beam from said second surface of said first substrate;
arranging said first substrate in said beam path of said first incident beam with said second surface facing towards said first incident beam, and interferometrically taking a second measurement of second wave fronts generated by reflecting said first incident beam from said second surface of said first substrate;
arranging a third surface of a second substrate in a beam path of a second incident beam, and interferometrically taking a third measurement of third wave fronts generated by reflecting said second incident beam from said third surface of said second substrate, while said first substrate is not arranged in said beam path of said second incident beam;
arranging said third surface of said second substrate and said first substrate in said beam path of said second incident beam, and interferometrically taking a fourth measurement of fourth wave fronts generated by reflecting said second incident beam from said third surface and through said first substrate; and
determining deviations of said optical surface from a target shape thereof in dependence of said first, second, third and fourth measurements.

15. The method according to claim 14, wherein said optical surface is said third surface of said second substrate.

16. The method according to claim 15, wherein said determined deviations correspond to calculated deviations substantially determined by a formula:

$$hM = \tfrac{1}{4}(-W2-W3+W4+W5)-h_{iM}$$

wherein:
hM represents said calculated deviations,
W2 represents phase differences determined from said first measurement,
W3 represents phase differences determined from said second measurement,
W4 represents phase differences determined from said third measurement,
W5 represents phase differences determined from said fourth measurement, and
$h_{iM}$ represents a predetermined input offset.

17. The method according to claim 14, wherein said optical surface to be qualified or manufactured, respectively, is said second surface of said first substrate.

18. The method according to claim 17, wherein said determined deviations correspond to calculated deviations substantially determined by a formula:

$$h2 = \tfrac{1}{4}(-W2+W3-W4+W5)-h_{i2}$$

wherein:
h2 represents said calculated deviations,
W2 represents phase differences determined from said first measurement,
W3 represents phase differences determined from said second measurement,
W4 represents phase differences determined from said third measurement,
W5 represents phase differences determined from said fourth measurement, and
$h_{i2}$ represents a predetermined input offset.

19. The method according to claim 14, further comprising:
arranging a fourth optical surface of a third substrate in said beam path of said first incident beam, and interferometrically taking a sixth measurement of seventh wave fronts generated by reflecting said first incident beam from said optical surface.

20. The method according to claim 19, wherein said optical surface to be qualified or manufactured, respectively, is said fourth surface of said third substrate.

21. The method according to claim 20, wherein said determined deviations correspond to calculated deviations substantially determined by a formula:

$$h0 = \tfrac{1}{4}(-W2-W3-W4+W5+2\ W6)-h_{i0}$$

wherein:
h0 represents said calculated deviations,
W2 represents phase differences determined from said first measurement,
W3 represents phase differences determined from said second measurement,
W4 represents phase differences determined from said third measurement,
W5 represents phase differences determined from said fourth measurement,
W6 represents phase differences determined from said sixth measurement, and
$h_{i0}$ represents a predetermined input offset.

22. The method according to claim 14, further comprising arranging said first substrate in said beam path of said first incident beam with said first surface facing towards said first incident beam, and interferometrically taking a fifth measurement of sixth wave fronts generated by reflecting said first incident beam from said first surface.

23. The method according to claim 22, wherein said optical surface to be qualified or manufactured, respectively, is said first surface of said first substrate.

24. The method according to claim 23, wherein said determined deviations correspond to calculated deviations substantially determined by a formula:

$$h1 = \tfrac{1}{4}(2W1-W2-W3-W4+W5)-h_{i1}$$

wherein:
h1 represents said calculated deviations,
W1 represents phase differences determined from said fifth measurement,
W2 represents phase differences determined from said first measurement,
W3 represents phase differences determined from said second measurement,
W4 represents phase differences determined from said third measurement,
W5 represents phase differences determined from said fourth measurement, and
$h_{i1}$ represents a predetermined input offset.

25. The method according to claim 14, wherein said first measurement is taken by superimposing said first wave fronts with fifth wave fronts generated by reflecting said first incident beam from said first surface of said first substrate.

26. The method according to claim 25, further comprising arranging said first substrate in said beam path of said first incident beam with said first surface facing towards said first incident beam, and interferometrically taking a fifth measurement of sixth wave fronts generated by reflecting said first incident beam from said first surface.

27. The method according to claim 26, wherein said optical surface to be qualified or manufactured, respectively, is said first surface of said first substrate and wherein said determined deviations correspond to calculated deviations substantially determined by a formula:

$$h1 = \tfrac{1}{4}(W1 - Wfr - W3 - W4 + W5) - h_{i1}$$

wherein:
h1 represents said calculated deviations,
W1 represents phase differences determined from said fifth measurement,
Wfr represents phase differences determined from said first measurement,
W3 represents phase differences determined from said second measurement,
W4 represents phase differences determined from said third measurement,
W5 represents phase differences determined from said fourth measurement, and
$h_{i1}$ represents a predetermined input offset.

28. The method according to claim 26, wherein said optical surface to be qualified or manufactured, respectively, is said second surface of said first substrate and wherein said determined deviations correspond to calculated deviations substantially determined by a formula:

$$h2 = \tfrac{1}{4}(-W1 - Wfr + W3 - W4 + W5) - h_{i2}$$

wherein:
h2 represents said calculated deviations,
W1 represents phase differences determined from said fifth measurement,
Wfr represents phase differences determined from said first measurement,
W3 represents phase differences determined from said second measurement,
W4 represents phase differences determined from said third measurement,
W5 represents phase differences determined from said fourth measurement, and
$h_{i2}$ represents a predetermined input offset.

29. The method according to claim 26, wherein said optical surface to be qualified or manufactured, respectively, is at least one of said first surface of said first substrate and said second surface of said first substrate and wherein said determined deviations correspond to calculated values substantially determined by a formula:

$$D = \tfrac{1}{2}(W5 - W4 - Wfr) + hi$$

wherein:
D represents said calculated values,
Wfr represents phase differences determined from said first measurement,
W4 represents phase differences determined from said third measurement,
W5 represents phase differences determined from said fourth measurement, and
hi represents a predetermined input offset.

30. The method according to claim 25, wherein said optical surface to be qualified or manufactured, respectively, is at least one of said first surface of said first substrate and said second surface of said first substrate and wherein said determined deviations correspond to calculated values substantially determined by a formula:

$$i = n \cdot (W_5 - W_4) - (n-1) \cdot W_{fr}$$

wherein:
i represents said calculated values,
Wfr represents phase differences determined from said first measurement,
W4 represents phase differences determined from said third measurement,
W5 represents phase differences determined from said fourth measurement, and
n represent an average index of refraction of a material of said first substrate.

31. The method according to claim 14, further comprising:
(j) machining said optical surface in dependence of said determined deviations.

32. The method according to claim 31, wherein said machining is only performed if said deviations exceed a predetermined threshold.

33. The method according to claim 31, wherein said determining of deviations and said machining are repeatedly performed.

34. The method according to claim 31, further comprising a finishing of said optical surface.

35. The method according to claim 34, wherein said finishing comprises applying a coating to said optical surface.

36. The method according to claim 35, wherein said coating comprises at least one of a reflective coating, an anti-reflective coating and a protective coating.

37. The method according to claim 14 wherein processing the substrate comprises manufacturing the substrate.

38. The method according to claim 14 wherein processing the substrate comprises qualifying the substrate.

* * * * *

UNITED STATES PATENT AND TRADEMARK OFFICE
CERTIFICATE OF CORRECTION

| | |
|---|---|
| PATENT NO. | : 7,050,175 B1 |
| APPLICATION NO. | : 10/637217 |
| DATED | : May 23, 2006 |
| INVENTOR(S) | : Rolf Freimann et al. |

It is certified that error appears in the above-identified patent and that said Letters Patent is hereby corrected as shown below:

Column 8, line 4, formula (13) delete "$h_M =_{1/4} (2W_4-W_2-W_3-+W_D)$" should read as;

--$h_M =_{1/4} (2W_4-W_2-W_3+W_D)$--

Signed and Sealed this

Fourteenth Day of November, 2006

JON W. DUDAS
*Director of the United States Patent and Trademark Office*